(12) United States Patent
D'Arrigo et al.

(10) Patent No.: US 7,777,285 B2
(45) Date of Patent: Aug. 17, 2010

(54) SEMICONDUCTOR DEVICE HAVING A SUSPENDED MICRO-SYSTEM

(75) Inventors: Giuseppe D'Arrigo, Sant'Agata Li Battiati (IT); Rosario Corrado Spinella, Catania (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 474 days.

(21) Appl. No.: 11/683,785

(22) Filed: Mar. 8, 2007

(65) Prior Publication Data

US 2007/0145501 A1    Jun. 28, 2007

Related U.S. Application Data

(62) Division of application No. 10/884,867, filed on Jul. 2, 2004, now Pat. No. 7,195,946.

(30) Foreign Application Priority Data

Jul. 4, 2003    (EP) .................................. 03425441

(51) Int. Cl.
*H01L 31/058* (2006.01)
(52) U.S. Cl. ...................... 257/419; 257/415; 257/416; 257/417; 257/418
(58) Field of Classification Search .......... 257/415–419
See application file for complete search history.

(56) References Cited

U.S. PATENT DOCUMENTS 6,021,675 A    2/2000  Seefeldt et al.

(Continued)

FOREIGN PATENT DOCUMENTS

EP    0 451 992    10/1991
EP    0 747 686    12/1996

OTHER PUBLICATIONS

Quanbo Zu et al., "Design and Fabrication ofSilicon Condenser Microphone Using Corrugated Diaphragm Technique", Journal of Microelectromechanical Systems, vol. 5, No. 3, Sep. 1996, pp. 197-203, XP000636781.

(Continued)

*Primary Examiner*—Kevin M Picardat
*Assistant Examiner*—Bac H Au
(74) *Attorney, Agent, or Firm*—Lisa K. Jorgenson; Stephen Bongini; Fleit Gibbons Gutman Bongini & Bianco P.L.

(57) ABSTRACT

A method is provided for fabricating a semiconductor device that includes a suspended micro-system. According to the method, a silicon porous layer is formed above a silicon substrate, and the silicon porous layer is oxidized. An oxide layer is deposited, and a first polysilicon layer is deposited above the oxide layer. The first polysilicon layer, the oxide layer, and the silicon porous layer are selectively removed. A nitride layer is deposited, and a second polysilicon layer is deposited. The second polysilicon layer, the nitride layer, the first polysilicon layer, and the oxide layer are selectively removed. The silicon porous layer is removed in areas made accessible by the previous step. Also provided is a semiconductor device that includes a suspended structure fixed to at least two walls through a plurality of hinges, with the suspended structure including an oxide layer, a first polysilicon layer, a nitride layer, and a second polysilicon layer.

20 Claims, 3 Drawing Sheets

U.S. PATENT DOCUMENTS

| | | | |
|---|---|---|---|
| 6,118,164 A * | 9/2000 | Seefeldt et al. | 257/417 |
| 6,225,140 B1 * | 5/2001 | Liu et al. | 438/48 |
| 6,734,762 B2 | 5/2004 | Cornett et al. | |
| 6,969,629 B2 * | 11/2005 | Kouma et al. | 438/50 |
| 7,083,997 B2 * | 8/2006 | Brosnihhan et al. | 438/50 |
| 2001/0026951 A1 | 10/2001 | Vergani et al. | |
| 2002/0189350 A1 | 12/2002 | Tu | |
| 2004/0183149 A1 * | 9/2004 | Schenk | 257/415 |
| 2005/0068608 A1 * | 3/2005 | Campbell et al. | 359/291 |
| 2005/0179099 A1 * | 8/2005 | Lutz et al. | 257/414 |
| 2006/0037932 A1 | 2/2006 | Lammel et al. | |

OTHER PUBLICATIONS

M.-A. Gretillat et al., "Electrostatic Polysilicon Microrelays Integrated with MOSFETs", Micro Electro Mechanical Systems, 1994, MEMS '94, Proceedings, IEEE Workshop on Oiso, Japan, Jan. 25-28, 1994, New York, NY, USA, IEEE, pp. 97-101, XP010207751.

L.-A. Liew et al., "Modeling of Thermal Actuation in a Bulk-Micromachined CMOS Micromirror", Microelectronics Journal, Mackintosh Publications Ltd., vol. 31, No. 9-10, Oct. 2000, pp. 791-801, XP004218842.

European Search Report dated Nov. 25, 2003 for European Application No. 03425441.7.

* cited by examiner

SEMICONDUCTOR DEVICE HAVING A SUSPENDED MICRO-SYSTEM

CROSS-REFERENCE TO RELATED APPLICATIONS

This application is a divisional of prior U.S. application Ser. No. 10/884,867, filed Jul. 2, 2004, now U.S. Pat. No. 7,195,946. The entire disclosure of U.S. application Ser. No. 10/884,867 is herein incorporated by reference.

Additionally, this application is based upon and claims priority from prior European Patent Application No. 03 425 441.7, filed Jul. 4, 2003, the entire disclosure of which is herein incorporated by reference.

BACKGROUND OF THE INVENTION

1. Field of the Invention

The present invention relates to semiconductor devices, and more particularly to a process for fabricating a semiconductor device having a suspended micro-system, the resultant semiconductor device, and its applications.

2. Description of Related Art

Suspended micro-systems, which are also known as semiconductor suspended structures, in integrated circuits are generally used in the case in which there is the necessity to provide orthogonal movements of portions of the surface of a crystal of silicon opportunely worked. The use of such micro-systems can be, for example, for the realization of a thermally moved micro-mirror.

The obtainment of such structures is a very complex process. The complexity is to be found in the impossibility of realizing sacrificial layers of elevated thickness, for example of about ten microns, with the VLSI and ULSI technologies.

Traditionally this drawback is resolved through the use of processes that require the bulk working (i.e., from the back) of the silicon structure through anisotropic erosion activated by basic solutions such as KOH or TMAH, or through techniques of wafer bonding or smart cutting, or by using silicon wafer on insulator technology.

SUMMARY OF THE INVENTION

In view of these drawbacks, it is an object of the present invention to overcome these drawbacks and to provide a simple to realize process for fabricating a semiconductor device that includes a suspended micro-system.

According to one embodiment of the present invention, there is provided a method for fabricating a semiconductor device that includes a suspended micro-system. According to the method, a silicon porous layer is formed above a silicon substrate, and the silicon porous layer is oxidized. An oxide layer is deposited, and a first polysilicon layer is deposited above the oxide layer. The first polysilicon layer, the oxide layer, and the silicon porous layer are selectively removed. A nitride layer is deposited, and a second polysilicon layer is deposited. The second polysilicon layer, the nitride layer, the first polysilicon layer, and the oxide layer are selectively removed. The silicon porous layer is removed in areas made accessible by the previous step.

According to another embodiment of the present invention, there is provided a semiconductor device that includes a silicon substrate, at least two walls located above the silicon substrate, and a suspended structure fixed to the two walls through hinges. The two walls include a first nitride layer and a second polysilicon layer, and the suspended structure includes an oxide layer, a first polysilicon layer, the nitride layer, and the second polysilicon layer.

According to a further embodiment of the present invention, there is provided a micro-mirror that is adapted to be fixed to at least two walls of a semiconductor device through a plurality of hinges. The micro-mirror is composed of a succession of layers that includes an oxide layer, a first polysilicon layer, a nitride layer, and a second polysilicon layer.

The present invention makes it possible to realize a suspended micro-system using a porous layer of silicon as sacrificial oxide and to create in such a way a three-dimensional structure below the suspended micro-system that allows the micro-system to move freely without touching structures near it. Preferably, the micro-system is suspended by hinges formed of the same material as the micro-system, but that has not been removed. The hinges are connected to walls that are formed during the fabrication of the device.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
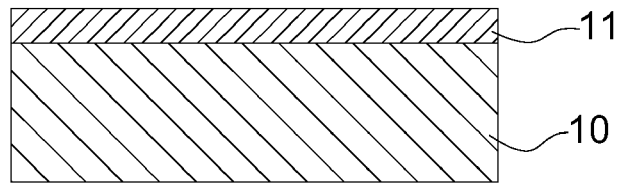
FIGS. 1-9 show the phases of a process for fabricating a semiconductor device having a suspended micro-system according to a preferred embodiment of the present invention.
Figure 2:
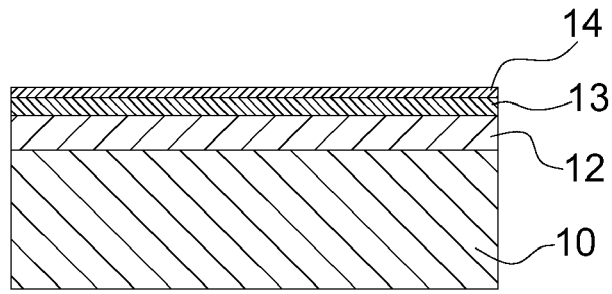

Preferred embodiments of the present invention will be described in detail hereinbelow with reference to the attached drawings.

With reference to FIGS. 1-9, there will now be described the phases of a process for fabricating a semiconductor device having a suspended micro-system according to a preferred embodiment of the present invention.

The substrate 10 is constituted by a wafer Cz (100) of p+ type, preferably with concentrations greater than $5*10^{17}$ B/cm$^3$. As an alternative, substrates of p– type can be used with an epitaxy p+ on the surface with a height that is at least equal to the porous structure 11 to be formed with a further enrichment on the back, with the purpose of getting a good ohmic contact for the formation of the porous layer 11 during the electrochemical process.

The first step of the process is the formation of a porous layer 11 with a desired height and porosity that can easily be fixed according to the time and the etching conditions (e.g., density of current, chemical parameters of the solution, and doping concentration).

Curves that allow valuing the variation of etch rate are available, as silicon thickness transformed by minute and the porosity variation in percentage, on the varying of the current density that flows in the cell of the electrochemical process. For example, for the realization of a porous silicon layer 11 with a thickness of 10 microns and a 70% porosity, 10 minutes are necessary and a current of between 20 and 40 mA/cm$^2$.

Through these processes it is possible to get a porous oxide layer of elevated thickness on the order of about some tens of microns.

The following step provides for the oxidation of the porous layer 11, to produce an oxidized porous layer 12. The oxidation is performed at low temperature, preferably around 900° C. for a brief period of 30 minutes, enough for oxidizing the thread-like structure with an average diameter of 50 nm (that can vary in accordance with the process) which constitutes the crystalline skeleton of the porous silicon. Through these processes it is possible to get a porous oxide layer of elevated thickness on the order of about ten microns.

After the oxidation process it is possible to close the superficial pores with a thin oxide layer PSG (Phosphorous Silicon Glass) 13, deposed through CVD (Chemical Vapor Deposition). There is then deposited a polysilicon layer 14, preferably with dimensions between 200 and 400 nm, that will be used as an etching mask for the porous oxide 12, given the elevated thickness of the oxidized structure.

If at this point it is necessary to suspend some structures in polysilicon, the porosity in the structure would create notable difficulties since in the processes of wet removal the sacrificial porous oxide, because of the dense net of capillary, would uniformly and totally be corroded under the polysilicon structure, so as to cause the separation not only of some structures to be suspended but also of the anchorages.

The following steps allow there to be realized some suspended structures in polysilicon by using the oxidized porous layer as a sacrificial layer.

Figure 3:
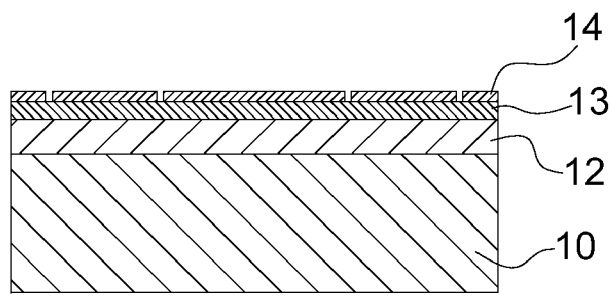

A process of deposition and photoengraving of the resist follows. Then a plasma etching of the polysilicon layer 14, preferably effected with a mixture of $Cl_2$ and HBr followed by a process with high selectivity with respect to the silicon oxide with a mixture of He, $O_2$, and HBr, is carried out, so as to delimit portions of the structure, as shown in FIG. 3.

Figure 4:
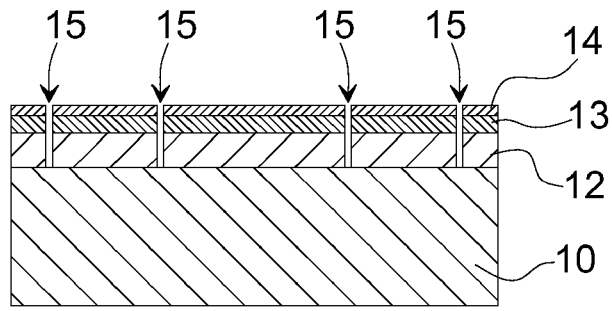

The structure so obtained is used as a dry etching mask, preferably with a mixture of $CF_4$, $CHF_3$, and Ar, for the oxide layer PSG 13 and the porous oxide layer 12, up to the substrate 10. Trenches 15 are therefore created, as shown in FIG. 4.

Figure 5:
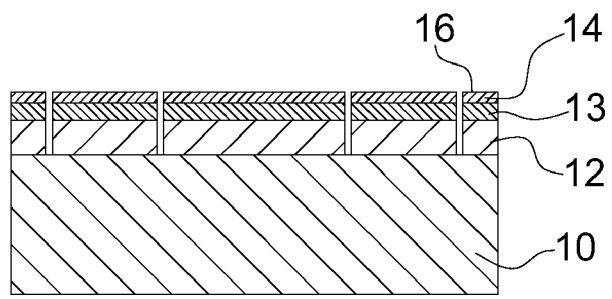
Figure 6:
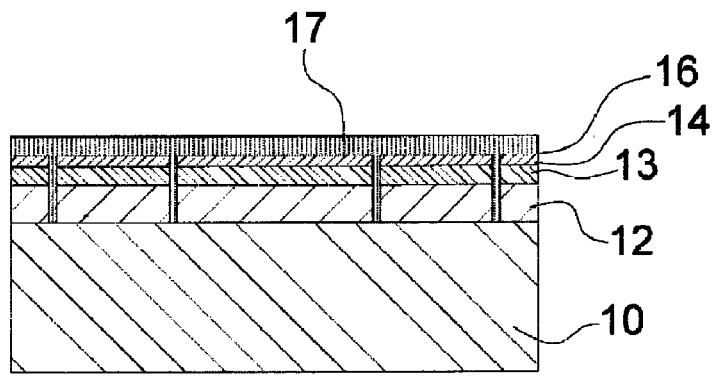

At this point the deposition of a nitride layer ($Si_3N_4$) 16 is executed through LPCVD (Low Pressure Chemical Vapor Deposition) on the whole device, preferably to a thickness of around 140 nm, so as to form a similar superficial layer that is also in the trenches 15, as shown in FIG. 5.

Then a polysilicon layer 17 is deposed, preferably through CVD using a mixture of $SiH_4$ and $AsH_3$ at a temperature of 660° C., so as to fill the trenches 15 and a superficial thickness at least equal to half the width of the trenches 15. The two layers 16 and 17 will uniformly distribute themselves on the whole surface so as to link to the silicon substrate.

Through this sequence of plasma depositions and etches it is possible to realize some three-dimensional structures of porous oxide 12, hooked to the substrate 10 and laterally and upwardly sealed by the nitride layer 16 and by the following layers.

Figure 7:
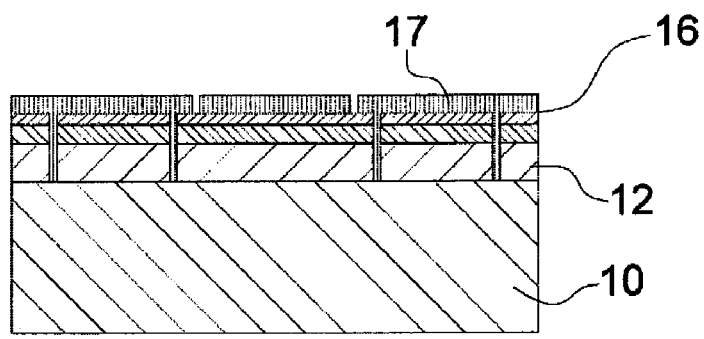

The process continues with the lithography of the polysilicon layer 17 that will be used as mask for the following etching, as shown in FIG. 7. There is then the plasma etching of the triple layer, effected in two phases by using the same procedure as for the erosion of the poly-Si 14, that is a plasma etching, preferably effected with a mixture of $Cl_2$ and HBr followed by a process with high selectivity with respect to the silicon oxide with a mixture of He, $O_2$, and HBr.

Figure 8:
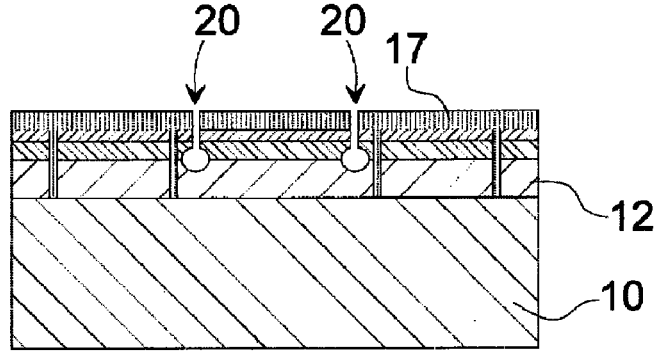

The nitride layers 16 and the oxide layer PSG 13 are removed with a plasma etching, preferably using a mixture of $CF_4$ and $CH_3Ar$, as shown in FIG. 8. In this way, zones 20 are created that go beyond the above-mentioned three layers and allow the following etching for the removal of the porous oxide 12.

The following wet etching, preferably with a solution containing HF, such as a water solution with a concentration of HF at 10% for a time of 1000 seconds, allows the selective removal of the porous oxide 12, so as to leave the oxide 13 untouched inside a three-dimensional structure 18, and therefore there is obtained the suspended structure 19. Thus, such a suspended structure 19 is obtained by sacrificing (eliminating) the porous oxide 11, and creating an empty space, that is the three-dimensional structure 18, below the suspended structure 19.

Figure 9:
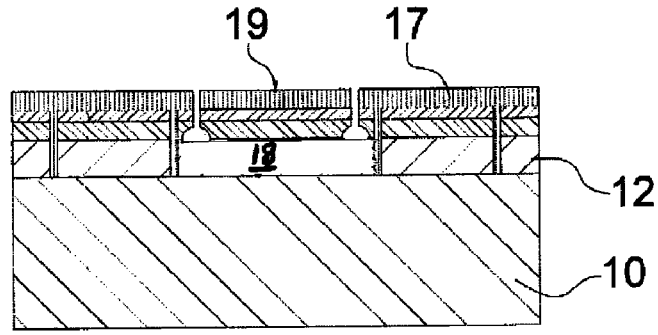

From FIG. 9 it seems that the suspended structure 19 is not bound to the device because it shows only a section. In reality the mask used for the etching, constituted by the polysilicon layer 17, is to be created so as to obtain a suspended structure 19 bound to the device through opportune hinges (as shown in FIG. 10) that are obtained through limited portions of structure that are not removed, according to the specific form desired for the suspended structure 19.

Figure 10:
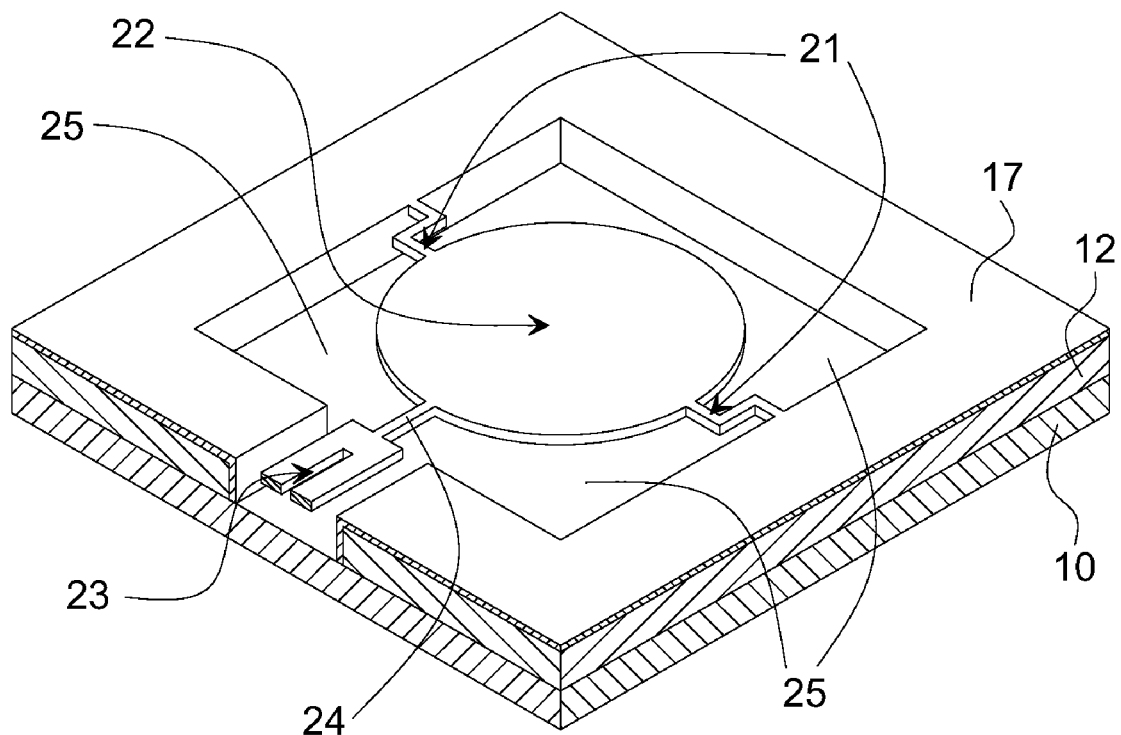
FIG. 10 shows a partial three-dimensional view of the structure of a micro-mirror that is obtained through a fabrication process according to an embodiment of the present invention.

FIG. 10 shows an exemplary application of the present invention. In fact, it shows the structure of a device obtained through the process described above, with the suspended structure 22 here representing a micro-mirror having hinges 21 that allow the suspension and the rotation of this suspended structure 22. The moving of the micro-mirror 22 is effected by a thermo-actuator 23 that, for example, exploits the thermo-mechanic effect of bimetallic foils that is obtained by the different thermal expansion of the materials depending on the variation of the temperature following the passage of current (in this exemplary case the materials are the layer of poly-Si and the underlying nitride layer, connected to the micro-mirror 22 through the hinge 24).

In this exemplary application, the lithographic process of the polysilicon layer 17, which will constitute the etching mask of the nitride layer 16, the polysilicon layer 14, and the oxide layer PSG 13, has been effected so as to define three areas 25 to free and so as to leave the opportunely shaped hinges 21 and 24 that hook the micro-mirror 22 to the device. In the following etching phase the porous layer 12 is removed in the areas 25 and under the micro-mirror 22.

The fabrication process of the present invention can be embedded in hardware, software, or a combination of hardware and software. Any processor, controller, or other apparatus adapted for carrying out the functionality described herein is suitable. For example, a machine-readable medium can be encoded with a program containing instructions for performing the steps of the method described above. A typical combination of hardware and software could include a general purpose microprocessor (or a controller) with a computer program that, when loaded and executed, carries out the functionality described herein.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A semiconductor device comprising:
a silicon substrate;
at least two walls located above the silicon substrate, the at least two walls each including a first nitride layer and a second polysilicon layer; and
a suspended structure fixed to the at least two walls through a plurality of hinges, the suspended structure including an oxide layer, a first polysilicon layer, the nitride layer, and the second polysilicon layer.

2. The semiconductor device according to claim 1,
wherein the at least two walls each consist of the first nitride layer and the second polysilicon layer, and
the suspended structure consists of, in succession, the oxide layer, the first polysilicon layer, the nitride layer, and the second polysilicon layer.

3. The semiconductor device according to claim 2, wherein the hinges each consist of, in succession, the oxide layer, the first polysilicon layer, the nitride layer, and the second polysilicon layer.

4. The semiconductor device according to claim 1, wherein the hinges each include the oxide layer, the first polysilicon layer, the nitride layer, and the second polysilicon layer.

5. The semiconductor device according to claim 1, further comprising an empty three-dimensional structure below the suspended structure.

6. The semiconductor device according to claim 1, wherein each of the hinges is formed by a portion of material that structurally connects one of the walls to the suspended structure.

7. The semiconductor device according to claim 1, wherein the suspended structure is a micro-mirror.

8. The semiconductor device according to claim 7, further comprising a thermo-actuator for moving the micro-mirror.

9. The semiconductor device according to claim 1, wherein the suspended structure is composed of a succession of layers that includes the oxide layer, the first polysilicon layer, the nitride layer, and the second polysilicon layer.

10. The semiconductor device according to claim 1, wherein there is an empty space below the suspended structure, and the hinges suspend the suspended structure over the empty space and allow rotation of the suspended structure.

11. A micro-mirror adapted to be fixed to at least two walls of a semiconductor device through a plurality of hinges, the micro-mirror being composed of a succession of layers that includes an oxide layer, a first polysilicon layer, a nitride layer, and a second polysilicon layer.

12. The micro-mirror according to claim 11, wherein the succession of layers consists of, in succession, the oxide layer, the first polysilicon layer, the nitride layer, and the second polysilicon layer.

13. An information processing system including a plurality of semiconductor devices, at least one of the semiconductor devices comprising:
a silicon substrate;
at least two walls located above the silicon substrate, the at least two walls each including a first nitride layer and a second polysilicon layer; and
a suspended structure fixed to the at least two walls through a plurality of hinges, the suspended structure including an oxide layer, a first polysilicon layer, the nitride layer, and the second polysilicon layer.

14. The information processing system according to claim 13,
wherein the at least two walls of the at least one semiconductor device each consist of the first nitride layer and the second polysilicon layer, and
the suspended structure of the at least one semiconductor device consists of, in succession, the oxide layer, the first polysilicon layer, the nitride layer, and the second polysilicon layer.

15. The information processing system according to claim 14, wherein the hinges of the at least one semiconductor device each consist of, in succession, the oxide layer, the first polysilicon layer, the nitride layer, and the second polysilicon layer.

16. The information processing system according to claim 13, wherein the hinges of the at least one semiconductor device each include the oxide layer, the first polysilicon layer, the nitride layer, and the second polysilicon layer.

17. The information processing system according to claim 13, wherein the at least one semiconductor device further comprises an empty three-dimensional structure below the suspended structure.

18. The information processing system according to claim 13, wherein each of the hinges of the at least one semiconductor device is formed by a portion of material that structurally connects one of the walls to the suspended structure.

19. The information processing system according to claim 13, wherein the suspended structure of the at least one semiconductor device is a micro-mirror.

20. The information processing system according to claim 19, wherein the at least one semiconductor device further comprises a thermo-actuator for moving the micro-mirror.

* * * * *